(12) United States Patent
Lu et al.

(10) Patent No.: US 6,642,128 B1
(45) Date of Patent: Nov. 4, 2003

(54) METHOD FOR HIGH TEMPERATURE OXIDATIONS TO PREVENT OXIDE EDGE PEELING

(75) Inventors: Ching-Shan Lu, Tainan (TW); Kuo-Bin Huang, Tainan (TW); Jih-Churng Twu, Chung-Ho (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 59 days.

(21) Appl. No.: 10/140,396

(22) Filed: May 6, 2002

(51) Int. Cl.⁷ ............................................. H01L 21/322
(52) U.S. Cl. ...................................................... 438/477
(58) Field of Search .................................. 438/477, 424, 438/296, 692, 800

(56) References Cited

U.S. PATENT DOCUMENTS 5,927,992 A * 7/1999 Hodges et al. .............. 438/297
6,051,346 A * 4/2000 Kornblit et al. ................ 430/5
6,235,608 B1 * 5/2001 Lin et al. ..................... 438/296

\* cited by examiner

Primary Examiner—Craig Thompson
(74) Attorney, Agent, or Firm—Tung & Associates

(57) ABSTRACT

A method for preventing oxide layer peeling in a high temperature annealing process including providing a plurality of spaced apart stacked semiconductor wafers for carrying out a high temperature annealing process including ambient nitrogen gas the plurality of spaced apart stacked semiconductor wafers stacked such that a process surface including an oxide layer of at least one semiconductor wafer is adjacent to a backside surface of another semiconductor wafer said backside surface having a layer of silicon nitride formed thereon prior to carrying out the high temperature annealing process; and, carrying out the high temperature annealing process.

19 Claims, 2 Drawing Sheets

METHOD FOR HIGH TEMPERATURE OXIDATIONS TO PREVENT OXIDE EDGE PEELING

FIELD OF THE INVENTION

This invention generally involves a method for carrying out high temperature oxidations on semiconductor wafers including semiconductor features and more particularly to a method for carrying thin layer high temperature oxidations including forming shallow trench isolation (STI) oxide liners.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, noise margin degradation, voltage shift and cross-talk.

Shallow trench isolation (STI), is the preferred electrical isolation technique especially for a semiconductor chip with high integration. Broadly speaking, conventional methods of producing a shallow trench isolation feature include: forming a hard mask over the targeted trench layer, patterning a soft mask over the hard mask, etching the hard mask through the soft mask to form a patterned hard mask, and thereafter etching the targeted trench layer to form the shallow trench isolation feature. Subsequently, the soft mask is removed (e.g., stripped) and the shallow trench isolation feature is back-filled with a dielectric material.

In the STI technique, the shallow trench isolation area is first defined to form isolation trenches surrounding active areas of the wafer including a PAD oxide layer overlying the semiconductor surface, for example silicon, and a polish-stop nitride layer overlying the PAD oxide layer. The isolation trench is then thermally oxidized to grow a thin silicon dioxide liner according to a either a wet or dry oxidation process to cover the isolation trench surfaces followed by a high temperature annealing process to improve the quality of the oxide including increasing the density. The isolation trench is then filled with a chemical vapor deposited (CVD) oxide and chemically mechanically polished (CMP) back to the polish-stop nitride layer to form a planar surface. The polish-stop nitride layer is then removed, for example, according to a wet etching process.

Generally, silicon dioxide layers can be grown within a temperature range from about 400 C. to about 1150 C. in either wet or dry atmospheres respectively, followed by an annealing process at from about 1000° C. to about 1150° C. to improve the quality of the oxide. The growth and annealing process may be carried out in resistance-heated furnaces or in rapid thermal process chambers with heat provided by, for example, tungsten-halogen lamps. Typically, either a horizontal or a vertical furnace tube is used for this purpose. After loading a batch of wafers into a furnace, the furnace is heated to (ramped-up) a temperature suitable for oxidation of the silicon substrate. The wafers are then held at the elevated temperature for a period of time and then cooled (ramped-down) to a lower temperature.

During the oxidation process, as wafers are heated in the furnaces, a temperature profile within the furnace develops whereby the temperature at the wafer edge is higher than at the wafer center, leading to non-uniformity in oxide layer growth. The non-uniformity of the temperature profile and therefore the oxide layer uniformity increases as wafer size increases (e.g., from 200 mm to 300 mm). In a high temperature annealing process, oxygen is mixed with an inert carrier gas such as nitrogen, and is passed over a batch of process wafers at an elevated temperature of about 1000° C. to about 1150° C.

One problem according to the prior art high temperature annealing processes in forming thin oxide layers, for example, STI trench oxide liners, is that the oxide layer tends to peel at the periphery of the semiconductor wafer. In particular, semiconductor wafers located in particular areas of the annealing furnace in a batch anneal process tend to experience oxide layer peeling believed to be due to specific temperature profiles and gas flow behavior at those particular areas.

There is therefore a need in the semiconductor processing art to develop an improved high temperature oxide annealing process whereby peeling of thin oxide layers at a semiconductor wafer periphery is prevented.

It is therefore an object of the invention to provide an improved high temperature oxide annealing process whereby peeling of thin oxide layers at a semiconductor wafer periphery is prevented including overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for preventing oxide layer peeling in a high temperature annealing process.

In a first embodiment, the method includes providing a plurality of spaced apart stacked semiconductor wafers for carrying out a high temperature annealing process including ambient nitrogen gas the plurality of spaced apart stacked semiconductor wafers stacked such that a process surface including an oxide layer of at least one semiconductor wafer is adjacent to a backside surface of another semiconductor wafer said backside surface having a layer of silicon nitride formed thereon prior to carrying out the high temperature annealing process; and, carrying out the high temperature annealing process.

These and other embodiments, aspects and features of the invention will become better understood from a detailed description of a preferred embodiment of the invention which is described in conjunction with the accompanying drawings.

DETAILED DESCRIPTION OF THE PREFERRED EMBODIMENTS

Figure 1A:
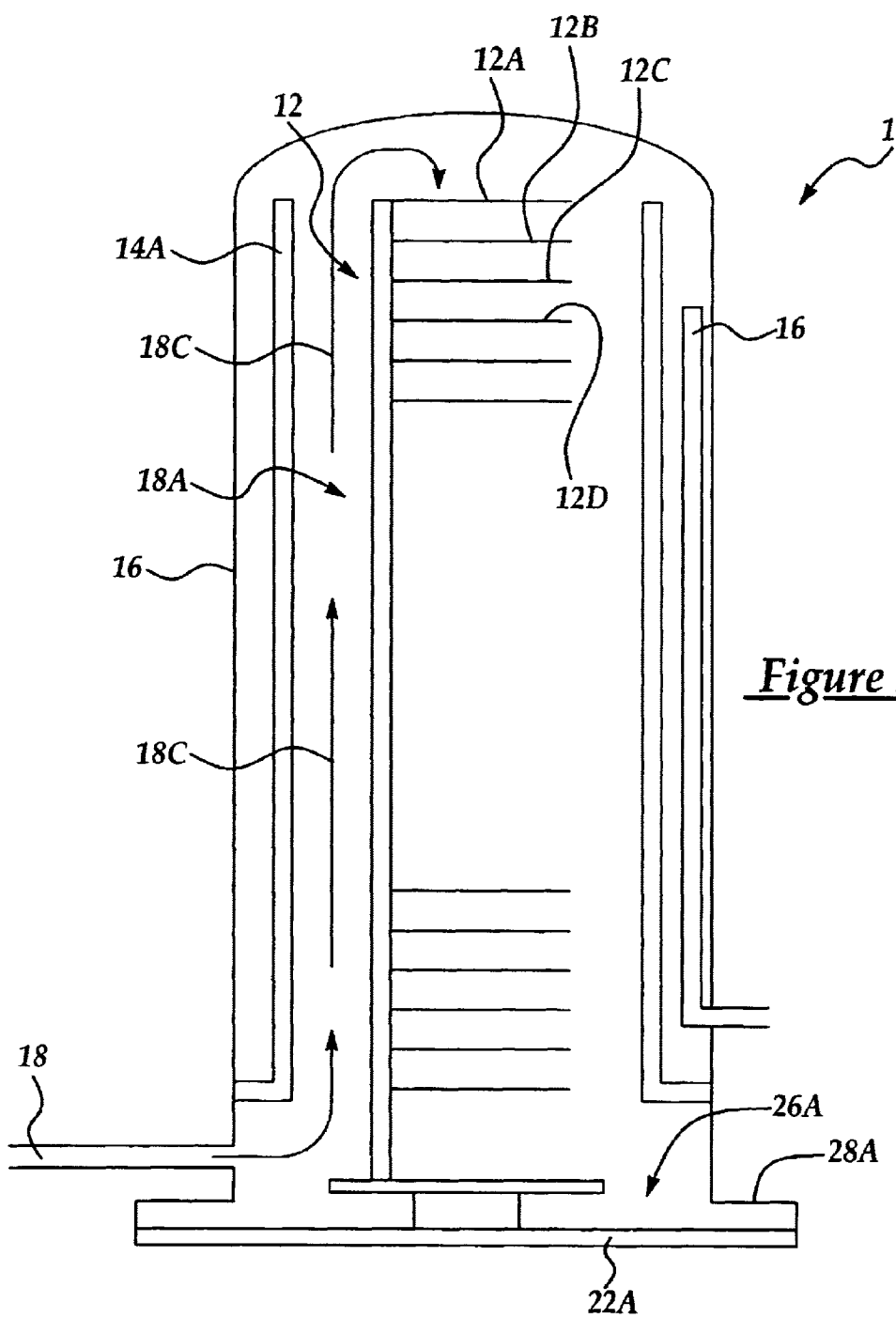
FIG. 1A is a cross-sectional side view representation of an exemplary annealing furnace for carrying out a batch semiconductor wafer high temperature annealing process according to an embodiment of the present invention.

Although the method of the present invention is explained by reference to an exemplary semiconductor manufacturing process, for example, forming an STI structures having a thermally grown silicon oxide liner, it will be appreciated that the method of the present invention is generally applicable to preventing the peeling of thin oxide layers, for example silicon oxide, when subjected to an annealing process. For example, the thin oxide layer may include thermally grown silicon oxide layers for forming gate oxide layers or oxide layers for lining other semiconductor features. In addition, although the method of the present invention is explained with reference to an exemplary tube furnace commonly used for annealing processes, it will be appreciated that the method of the present invention may be advantageously adapted with respect to any furnace used for annealing semiconductor wafers.

In a first embodiment of the present invention, in a semiconductor wafer batch high temperature annealing process including a plurality of spaced apart stacked semiconductor wafers stacked such that a process surface of one semiconductor wafer is adjacent to a backside surface of another semiconductor wafer for at least a portion of the plurality of semiconductors said backside surface of the at least a portion of the plurality of spaced apart stacked semiconductor wafers provided with a layer of silicon nitride prior to carrying out a high temperature annealing process including nitrogen gases. By the term 'backside surface' is meant the major surface of the control wafer opposite and parallel to the process surface of the control wafer, the process surface for example, including a silicon oxide layer forming a shallow trench isolation oxide liner.

Preferably the at least a portion of the plurality of spaced apart stacked semiconductor wafers provided with a layer of silicon nitride over the backside surfaces include control wafers for monitoring the high temperature annealing process including at least one of monitoring an annealing temperature, monitoring electrical properties, or monitoring an annealed film thickness. Preferably, the backside surfaces are provided with a layer of silicon nitride covering an exposed silicon surface. Preferably the silicon nitride layer is deposited at a thickness of from about 300 Angstroms to about 2000 Angstroms, more preferably about 1600 Angstroms. The silicon nitride (e.g., $Si_3N_4$) may be deposited by any means including physical vapor deposition (PVD), chemical vapor deposition (CVD), or gaseous nitridization by methods known in the art.

It has been found according to the present invention that provision of a backside surface with a layer of silicon nitride in at least a portion of the stacked semiconductor wafers eliminates the problem of oxide peeling, for example, an STI oxide liner at the peripheral portions of a semiconductor wafer. Although the precise reasons for the induced oxide peeling during a high temperature annealing process are unknown, it is believed that a high temperature anneal with nitrogen present induces silicon nitridization to form silicon nitride at the wafer periphery leading to oxide layer, for example, STI oxide liner, peeling. It has been found that oxide peeling can be avoided in the high temperature annealing process by providing a silicon nitride layer over a backside wafer surface of one wafer adjacent to a process of another wafer in a batch wafer process including stacked spaced apart semiconductor wafers. Although the precise reasons for the success of the method of the present invention in prevention oxide layer peeling are unknown, it is believed to be related to complex interactions of wafer periphery temperature gradient, gas flow patterns, local gas concentration gradients, and nitridization processes. For example, it has been found that the problem of oxide peeling may be limited to particular areas of the semiconductor stack where the annealing conditions induce the undesired interactions to cause oxide peeling.

In one embodiment, a control wafer including the silicon nitride layer formed on the backside is provided in a furnace for carrying out a semiconductor wafer batch annealing process for annealing an STI oxide liner the control wafer being disposed within a gas flow pathway for supplying nitrogen process gas to the semiconductor wafers.

Figure 1B:
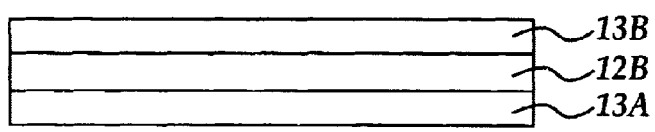
FIG. 1B is an expanded cross sectional side view of a portion of a control wafer according to an embodiment of the invention.

For example, referring to FIG. 1A is shown a cross sectional representation of a portion of an exemplary furnace for carrying out an annealing process according to the present invention. For example, vertically oriented low pressure (LP) furnace 10 is shown with quartz wafer boat 12 including a cassette portion for holding a plurality of semiconductor wafers e.g., 12A, 12B, 12C, 12D. Surrounding the wafer boat 12 is a cylindrical inner tube 14A, for example, quartz that is ambiently sealed at the bottom portion of outer tube 16, for example, formed of quartz. A temperature monitor to monitor the furnace temperature, for example, a thermocouple in thermocouple sleeve 16 or an optical pyrometer (not shown) disposed outside the LP furnace to monitor the upward facing surface of one or more of semiconductor wafers, for example semiconductor control wafer 12A. For example, control wafers e.g., 12A, and 12B are typically located in an upper portion (zone) of the furnace having a process surface facing upward and a backside surface facing downward. For example, the backside of control wafer 12B is disposed adjacent and above the semiconductor process wafer 12C process surface. Preferably, according to one embodiment of the present invention the backside (e.g., downward facing surface) of at least one of the plurality of semiconductor wafers e.g., control wafer 12B is disposed adjacent to the process surface of another semiconductor wafer, for example, process wafer 12C the backside of semiconductor control wafer 12B being provided with a layer of silicon nitride. For example, referring to FIG. 1B is shown an expanded view of control wafer 12B having a layer of silicon nitride 13A formed on a backside surface e.g., downward facing surface as oriented in FIG. 1A and having a process surface oxide layer e.g., 13B, for example an STI oxide liner.

Process gases, preferably including nitrogen gas, fed through gas inlet 18 including a portion of the gas flowing along the wafer boat 12 through space 18A as indicated by direction arrows e.g., 18C to contact the control wafers e.g., 12A, 12B in the upper portion the stacked spaced apart semiconductor wafers including process wafers e.g., 12C, 12D. A lid member 22A supports the wafer boat 12 and typically is equipped with an O-ring for providing a hermetic seal. In operation, the wafer boat 12 holding a plurality of process wafers is conveyed upward through a lower aperture 26A of the manifold 28A with lid member 22A forming a hermetic seal with manifold 28A. The wafers are may be heated with resistive elements or high intensity lamps located outside the LP furnace (not shown).

Figure 2A:
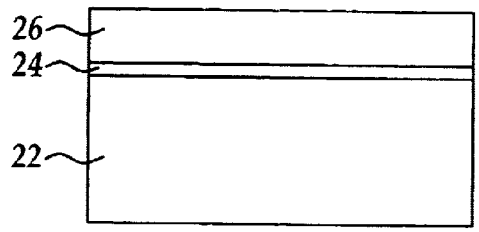
FIGS. 2A–2E are cross-sectional side view representations of a portion of an exemplary semiconductor device including an STI oxide liner formed according to stages in an STI manufacturing process including a high temperature annealing process according to an embodiment of the present invention.

Referring to FIG. 2A, in an exemplary process for forming an oxide layer, is shown an exemplary cross sectional side view of a portion of a semiconductor wafer at a stage in an STI manufacturing process including a silicon substrate 22 with pad oxide layer 24 formed over the silicon substrate 22 and a silicon nitride layer 26 formed over the PAD oxide layer 24.

In a typical STI process silicon substrate 22 typically comprises monocrystalline silicon. A pad oxide layer 24 (silicon oxide e.g.,$SiO_2$) is grown over the silicon substrate 22. The purpose of the pad oxide layer 24 is to provide an adhesion layer for the silicon nitride layer 26 and to reduce surface stress in the semiconductor substrate 22. The pad oxide layer 24 is thermally grown to a thickness of between about 100 Angstroms and 300 Angstroms using conventional thermal oxidation processes.

The silicon nitride layer 26 is deposited overlying the pad oxide layer 24. The silicon nitride layer 26 can serve as both a hard mask during subsequent etching of STI trench openings and as a polish stop during chemical mechanical polishing (CMP) to remove excess silicon oxide used to subsequently fill the STI trench openings. The silicon nitride layer is preferably deposited using a low pressure chemical vapor deposition (LPCVD) process to a thickness of between about 1,000 Angstroms and 3,000 Angstroms.

Figure 2B:
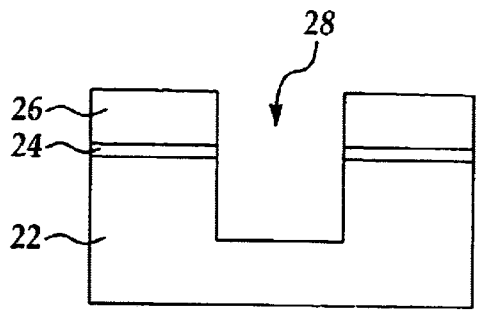

Referring to FIG. 2B, STI trench openings e.g. 28 extending through said silicon nitride layer 26 and pad oxide layer 24 are anisotropically etched into the silicon substrate 22 according to a conventional RIE etching process. In forming the STI trench openings e.g., 28, the silicon nitride layer 26 and the pad oxide layer 24 are patterned by conventional photolithographic processes and anisotropically etched to form a hard mask for anisotropic trench etching. In a conventional photolithographic process, photoresist is coated, exposed, and developed to reveal portions of the silicon nitride layer 26 that are subsequently anisotropically etched through the thickness of the silicon nitride layer 26 using a conventional plasma or reactive ion etching (RIE) process. In a second RIE etching process the STI trench openings e.g., 28 are etched into the silicon substrate to a depth of between about 1,500 Angstroms and 3,500 Angstroms.

Figure 2C:
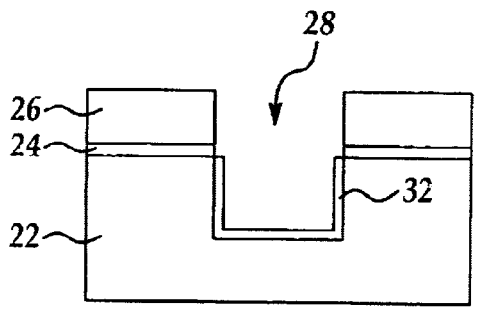

Referring to FIG. 2C, a silicon oxide layer is thermally grown over the exposed silicon substrate 22 by a conventional thermal oxidation technique to form a conformally grown STI oxide liner 32 of from about 50 to about 300 Angstroms in thickness. For example, a thermal oxidation of the sidewalls and bottom portion of the STI trench opening 28 in a dry or wet oxygen containing ambient is carried out at a temperature of about 800° C. to about 1100° C. Alternatively, the silicon oxide layer to form the STI oxide liner 32 may be deposited using low pressure chemical vapor deposition (LPCVD) at a temperature in the range of about 400° C.–750° C. The STI oxide liner 32 serves to relieve stresses and repair defects induced during trench formation. The STI oxide liner is subsequently annealed in a high temperature annealing process, for example a wafer batch annealing process, in an inert gas, for example, nitrogen at a temperature greater than about 900° C., more preferably at a temperature of from about 1000° C. to about 1150° C. to densify the STI oxide liner. Preferably, the high temperature annealing process is a batch semiconductor wafer annealing process according to the preferred embodiments of the present invention to prevent STI oxide peeling, for example, at the semiconductor wafer periphery.

Figure 2D:
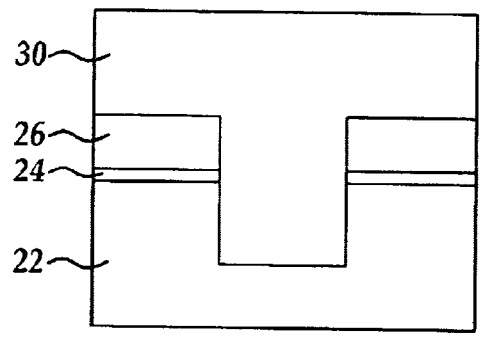
Figure 2E:
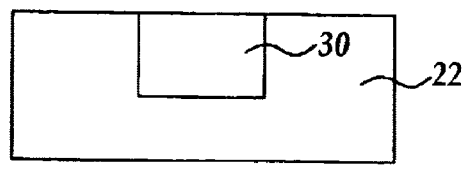

Referring to FIG. 2D, the STI structure is then completed by conventional methods including filling the STI trench opening 28 with a dielectric insulating material layer 30, for example, silicon dioxide, to cover the STI oxide liner (not shown), by a spin on glass process or a CVD process, for example and HDP-CVD process. Referring to FIG. 2E, a CMP processes is performed to remove the excess insulating material layer 30 overlying the silicon nitride layer 26, followed by wet etching to remove the silicon nitride layer 26 and pad oxide layer 24 to complete to formation of the STI structure.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preventing oxide layer peeling in a high temperature oxide layer annealing process comprising the steps of:

providing a plurality of spaced apart stacked semiconductor wafers for carrying out a high temperature oxide layer annealing process including ambient nitrogen gas the plurality of spaced apart stacked semiconductor wafers stacked such that a process surface including the oxide layer of at least one semiconductor wafer is positioned adjacent to a backside surface of a control wafer said backside surface having a layer of silicon nitride formed thereon prior to carrying out the high temperature annealing process; and, carrying out the high temperature oxide layer annealing process.

2. The method of claim 1, wherein the silicon nitride layer is formed at a thickness of from about 300 Angstroms to about 2000 Angstroms.

3. The method of claim 1, wherein the control wafer is provided for monitoring at least one of annealing temperature, oxide layer thickness, and semiconductor wafer electrical resistance.

4. The method of claim 1, wherein the control wafer is disposed in a gas flow pathway for supplying the ambient nitrogen gas to the plurality of spaced apart stacked semiconductor wafers.

5. The method of claim 1, wherein the high temperature oxide layer annealing process is carried out in one of a vertically and horizontally oriented furnace.

6. The method of claim 1, wherein the oxide layer is a silicon oxide layer formed on a silicon substrate.

7. The method of claim 6, wherein the silicon oxide layer is conformally formed over a shallow trench isolation trench opening.

8. The method of claim 7, wherein the silicon oxide layer is formed at a thickness of from about 50 Angstroms to about 300 Angstroms.

9. The method of claim 1, wherein the oxide layer is a silicon oxide layer forming at least one of a pad oxide, a shallow trench isolation liner, and a gate oxide.

10. The method of claim 1, wherein the high temperature annealing process is carried out at a temperature of from about 1000 degrees Centigrade to about 1150 degrees Centigrade.

11. A method for preventing silicon oxide layer peeling in a high temperature silicon oxide layer annealing process comprising the steps of:

providing a plurality of spaced apart stacked semiconductor wafers for carrying out a high temperature silicon oxide layer annealing process including ambient nitrogen gas the plurality of spaced apart stacked semiconductor wafers stacked such that at least one semiconductor wafer having a process surface including the silicon oxide layer formed thereon is adjacently disposed to a backside surface of an adjacently disposed semiconductor wafer said backside surface having a layer of silicon nitride formed thereon prior to carrying out the high temperature silicon oxide layer annealing process; and, annealing the silicon oxide layer at a temperature above about 900 degrees Centigrade.

12. The method of claim 11, wherein the silicon nitride layer is formed at a thickness of from about 300 Angstroms to about 2000 Angstroms.

13. The method of claim 11, wherein the adjacently disposed semiconductor wafer is a control wafer for monitoring the silicon oxide layer.

14. The method of claim 13, wherein the control wafer is provided for monitoring at least one of annealing temperature, silicon oxide layer thickness, and semiconductor wafer electrical resistance.

15. The method of claim 13, wherein the control wafer is disposed in a gas flow pathway for supplying the ambient nitrogen gas to the plurality of spaced apart stacked semiconductor wafers.

16. The method of claim 11, wherein the step of annealing is carried out in one of a vertically and horizontally oriented furnace.

17. The method of claim 11, wherein the silicon oxide layer is formed on a silicon substrate.

18. The method of claim 17, wherein the silicon oxide layer is conformally formed over a shallow trench isolation trench opening.

19. The method of claim 18, wherein the silicon oxide layer is formed at a thickness of from about 50 Angstroms to about 300 Angstroms.

* * * * *